United States Patent
Chan

(10) Patent No.: US 10,910,773 B2
(45) Date of Patent: Feb. 2, 2021

(54) POWER CONVERSION DEVICE WITH ELECTRIC ARC SUPPRESSION

(71) Applicant: Acer Incorporated, New Taipei (TW)

(72) Inventor: Tzu-Tseng Chan, New Taipei (TW)

(73) Assignee: Acer Incorporated, New Taipei (TW)

( * ) Notice: Subject to any disclaimer, the term of this patent is extended or adjusted under 35 U.S.C. 154(b) by 257 days.

(21) Appl. No.: 16/111,175

(22) Filed: Aug. 23, 2018

(65) Prior Publication Data

US 2020/0028304 A1    Jan. 23, 2020

(30) Foreign Application Priority Data

Jul. 18, 2018  (TW) .............................. 107124822 A

(51) Int. Cl.
    *H02H 3/00*      (2006.01)
    *H01R 13/652*    (2006.01)
    *H03K 17/687*    (2006.01)

(52) U.S. Cl.
    CPC ......... *H01R 13/652* (2013.01); *H03K 17/687* (2013.01)

(58) Field of Classification Search
    None
    See application file for complete search history.

(56) References Cited

U.S. PATENT DOCUMENTS

| | | | | |
|---|---|---|---|---|
| 5,831,351 A | * | 11/1998 | Khosrowpour | G06F 13/4081 307/139 |
| 7,339,772 B2 | * | 3/2008 | Ochi | H02H 9/004 361/111 |
| 9,257,854 B2 | * | 2/2016 | Huang | H02J 7/0031 |

* cited by examiner

*Primary Examiner* — Stephen W Jackson
(74) *Attorney, Agent, or Firm* — JCIPRNET

(57) ABSTRACT

A power conversion device is provided for supplying power to an electronic device. The power conversion device includes a power supply connector, a voltage conversion circuit, a switch circuit and a detection circuit. The power supply connector is configured to couple with the electronic device. The voltage conversion circuit is configured to provide a suitable voltage level for the electronic device. The switch circuit is coupled between the voltage conversion circuit and the power supply connector. When the power supply connector is coupled with the electronic device and a ground pin of the power supply connector is fully shielded, the detection circuit configures the switch circuit to be conducted for supplying power to the electronic device.

5 Claims, 3 Drawing Sheets

POWER CONVERSION DEVICE WITH ELECTRIC ARC SUPPRESSION

CROSS-REFERENCE TO RELATED APPLICATION

This application claims the priority benefit of Taiwan application serial no. 107124822, filed on Jul. 18, 2018. The entirety of the above-mentioned patent application is hereby incorporated by reference herein and made a part of this specification.

BACKGROUND

Technical Field

The disclosure relates to a power conversion device, particularly to a power conversion device with electric arc suppression.

Related Art

Power conversion devices are used in many electronic devices, so as to convert the power provided by power source (e.g., the grid power or batteries) to a voltage level suitable for the electronic devices. For instance, the power conversion device can convert the voltage level of 110V or 230V provided by the grid power to the voltage level of 19V or 5V suitable for a notebook.

The power conversion device usually includes a plug, a voltage conversion circuit, and a power supply connector. The plug is configured to be electrically coupled to the socket of the grid power. The voltage conversion circuit is configured to perform voltage conversion function. The power supply connector is configured to be electrically coupled to a power input connector of the electronic device. The power supply connector includes a ground pin and a power supply pin, and the power supply connector is generally designed as having an insulating element disposed between the ground pin and the power supply pin surrounded by the ground pin. The power input connector includes a ground pin and a power input pin. The power input connector is generally designed as having the ground pin surrounding the power input pin and an insulating element surrounding the ground pin.

When the power supply connector is electrically coupled to the power input connector, the two ground pins on the periphery may be electrically coupled to each other before the power supply pin is electrically coupled to the power input pin. When the power supply pin is electrically coupled to the power input pin, the ground pin of the power supply connector or the ground pin of the power input connector may still have partial metal exposed to the air, which usually causing an arc discharge on the metal surface (also known as electric arc). The phenomenon described above is not comply with the safety regulations of electronic devices and may also cause damage to the electronic device or the user.

SUMMARY

In view of the above, embodiments of the disclosure propose a power conversion device to solve the problem about the electric arc described above.

In one embodiment of the disclosure, a power conversion device configured for being electrically coupled to an power source to provide power to an electronic device is provided. The power conversion device includes a power supply connector, a voltage conversion circuit, a switch circuit and a detection circuit. The power supply connector includes a first ground pin, a power supply pin and a first detection pin respectively configured to be electrically coupled to a second ground pin, a power input pin and a second detection pin of a power input connector of the electronic device. The voltage conversion circuit is configured to be electrically coupled to the power source to provide power at an output voltage level suitable for the electronic device according to the power source. The switch circuit is electrically coupled to the voltage conversion circuit and the power supply pin. The detection circuit is electrically coupled to the first detection pin, the voltage conversion circuit and the switch circuit for configuring the switch circuit to be conducted or non-conducted. After the power supply connector is electrically coupled to the power input connector and the first ground pin and the second ground pin are fully shielded, the power supply pin and the first detection pin are electrically coupled to the power input pin and the second detection pin respectively. When the detection circuit detects that the first detection pin is electrically coupled to the second detection pin, the detection circuit configures the switch circuit to be conducted, which makes the voltage conversion circuit to provide power to the electronic device through the switch circuit and the power input pin.

Based on the above, both of the connector structure and the circuit of the power conversion device in the embodiment of the disclosure are designed for suppressing the electric arc, so as to effectively prevent the generation of the electric arc and improve safety.

To make the above features and advantages of the disclosure more comprehensible, several embodiments accompanied with drawings are described in detail as follows.

DETAILED DESCRIPTION OF DISCLOSED EMBODIMENTS

Figure 1:
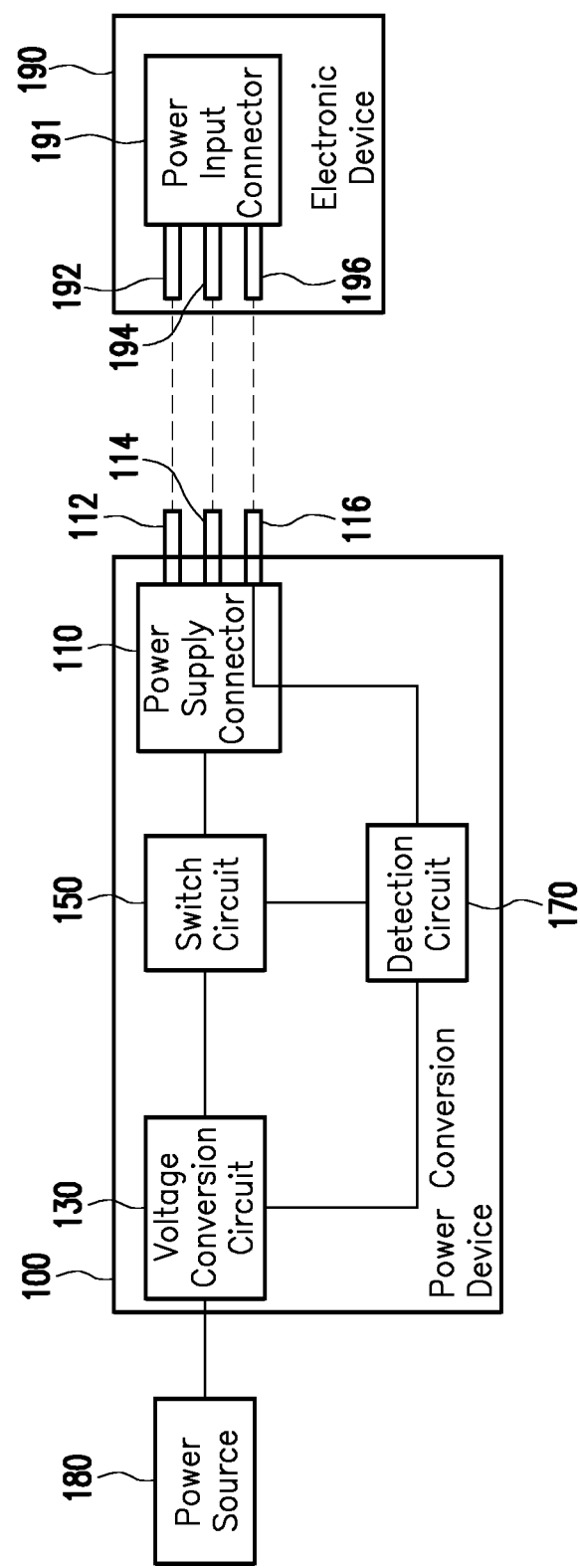
FIG. 1 is a function block diagram illustrating a power conversion device according to one embodiment of the disclosure.

Some embodiments of the disclosure will be hereinafter described in detail with reference to the accompanying drawings. In the following description, the same reference numerals in different drawings represent the same or similar elements. These embodiments are only a part of the disclosure and do not disclose all of the possible implementations of the disclosure.

FIG. 1 is a function block diagram illustrating a power conversion device 100 according to one embodiment of the disclosure. The power conversion device 100 is configured to be electrically coupled to the power source 180 to provide power to an electronic device 190. The power conversion device 100 includes the power supply connector 110, the voltage conversion circuit 130, the switch circuit 150 and the detection circuit 170. For purposes of making the drawings clarity and ease of explanation, other components are not shown in the drawings. In the present embodiment, the power conversion device 100 is electrically coupled to a socket of the grid power through a plug (not shown) to be coupled to the power source 180. The power source 180 can provide DC power or AC power, and the power conversion device 100 can output a suitable voltage level according to the power source 180 so as to provide power to the electronic device 190.

The power supply connector 110 includes the first ground pin 112, the power supply pin 114 and the first detection pin 116 respectively configured to be coupled to the second ground pin 192, the power input pin 194 and the second detection pin 196 of the power input connector 191 of the electronic device 190.

The voltage conversion circuit 130 may include a transformer, a rectifier and the other electronic components (not shown) and is configured to be electrically coupled to the power source 180, such that the power source 180 can be converted to the output voltage level suitable for the electronic device 190. For instance, the voltage conversion circuit 110 can convert an AC voltage level of 110V or 230V to a DC voltage level of 19V suitable for the notebook computer.

The switch circuit 150 is electrically coupled between the voltage conversion circuit 130 and the power supply connector 110.

The detection circuit 170 is electrically coupled to the first detection pin 116, the voltage conversion circuit 130 and the switch circuit 150. The detection circuit 170 configures the switch circuit 150 to be conducted or non-conducted so that the power conversion device 100 provide or does not provide power to the electronic device 190.

In order to avoid the electric arc, after the power supply connector 110 is electrically coupled to the power input connector 191 and the first ground pin 112 and the second ground pin 192 are fully shielded, the power supply pin 114 and the first detection pin 116 are respectively coupled to the power input pin 194 and the second detection pin 196. When the detection circuit 170 detects that the first detection pin 116 is electrically coupled to the second detection pin 196, the detection circuit 170 configures the switch circuit 150 to be conducted, such that the voltage conversion circuit 130 may provide power to the electronic device 190 through the switch circuit 150 and the power supply pin 114. The power conversion device 100 provides the power to the electronic device 190 only if the first ground pin 112 and the second ground pin 192 are fully shielded (i.e., without any metal of the first ground pin 112 or the second ground pin 192 exposed to the air), and thus the electronic arc can be avoided.

Figure 2:
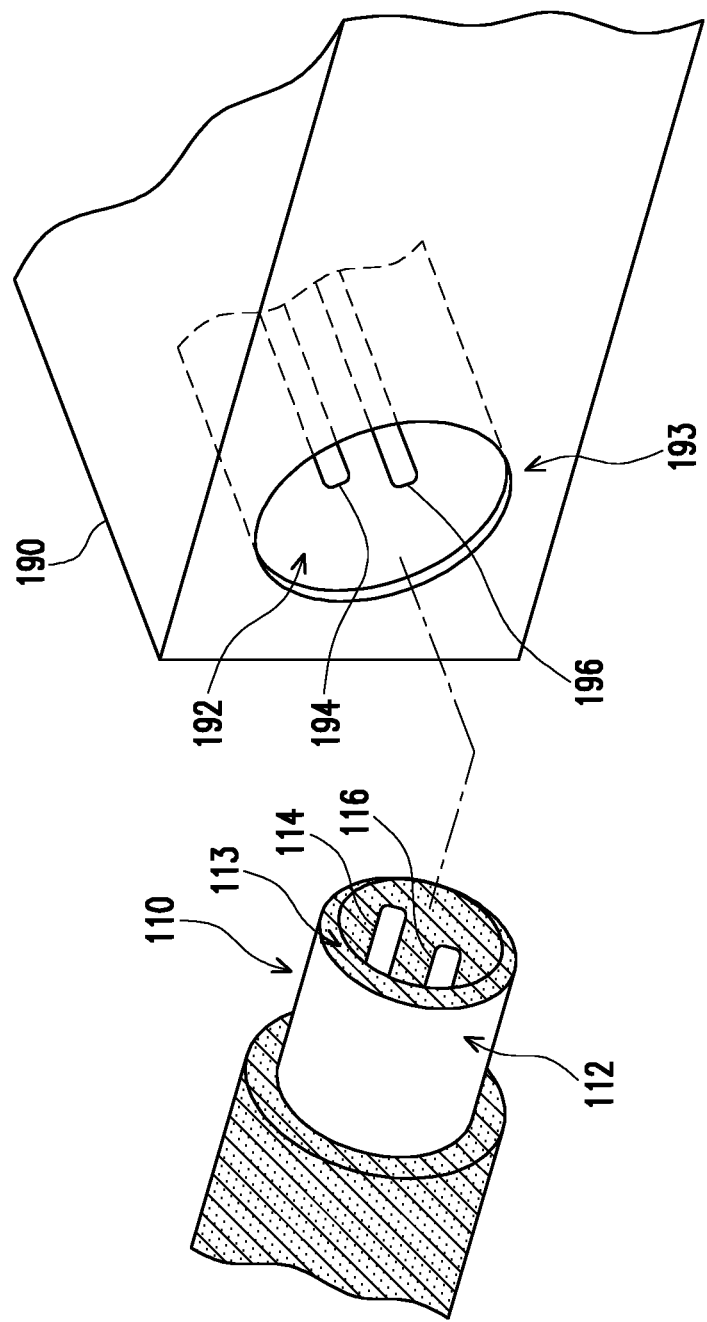
FIG. 2 is a function block diagram illustrating the power supply connector and the power input connector in FIG. 1 according to one embodiment of the disclosure.

FIG. 2 is a function block diagram illustrating the power supply connector 110 and the power input connector 191 in FIG. 1 according to one embodiment of the disclosure. In the embodiment of FIG. 2, the power supply connector 110 is configured to be tubular-shape, and the power supply connector 110 further includes an insulating element 113 surrounding the power supply pin 114 and the first detection pin 116. The first ground pin 112 surrounds the power supply pin 114 and the first detection pin 116 with the insulating element 113 disposed therebetween. The second ground pin 192 of the power input connector 191 surrounds the power input pin 194 and the second detection pin 196, and the power input connector 191 further includes an insulating element 193 surrounding the second ground pin 192. The insulating element 193 may be an independent component for covering the second ground pin 192 or may be integrated with a housing or other components of the electronic device 190.

When the power supply connector 110 is coupled to the power input connector 191, the power supply connector 110 is plugged into a space surrounded by the second ground pin 192, such that the first ground pin 112 is electrically coupled to the second ground pin 192. Further, after the power supply connector 110 is fully plugged into the power input connector 191 and the first ground pin 112 and the second ground pin 192 are fully shielded by the insulating element 193 or other components, the power supply pin 114 and the first detection pin 116 are respectively coupled to the power input pin 194 and the second detection pin 196. Moreover, when the first ground pin 112 and the second ground pin 192 are fully shielded, the power supply pin 114 and the first detection pin 116 are configured to be respectively coupled to the power input pin 194 and the second detection pin 196 simultaneously or non-simultaneously. No matter the power supply pin 114 and the first detection pin 116 are respectively coupled to the power input pin 194 and the second detection pin 196 simultaneously or non-simultaneously, the electrical connection between the power supply pin 114 and the power input pin 194 and the electrical connection between the first detection pin 116 and the second detection pin 196 are accomplished only if the first ground pin 112 and the second ground pin 192 are fully shielded, so as to avoid the electronic arc.

In one embodiment, in the process of plugging the power supply connector 110 into the power input connector 191, the power supply pin 114 may be coupled to the power input pin 194 first. Further, the first detection pin 116 and the second detection pin 196 are not electrically coupled to each other until the first ground pin 112 and the second ground pin 192 are fully shielded by the insulating element 193. Therefore, when the first ground pin 112 and the second ground pin 192 are not fully shielded, the detection circuit 170 configures the switch circuit 150 to be non-conducted since the first detection pin 116 and the second detection pin 196 have not been electrically coupled to each other yet, such that the voltage conversion circuit 130 and the power supply pin 114 (and the power input pin 194) become open-circuited and hence the power conversion device 100 does not provide power to the electronic device 190. After the power supply connector 110 is electrically coupled to the power input connector 190 and the first ground pin 112 and the second ground pin 192 are fully shielded, the first detection pin 116 is electrically coupled to the second detection pin 196 and the detection circuit 170 configures the switch circuit 150 to be conducted, which makes the voltage conversion circuit 130 to become short-circuited with the power supply pin 114 (and the power input pin 194) and hence to provide power to the power input connector 190. Therefore, even if the power supply pin 114 has been coupled to the power input pin 194 first, the first detection pin 116 and the second detection pin 196 are not electrically coupled to each other and the power conversion device 100 does not provide power to the electronic device 190 until the first ground pin 112 and the second ground pin 192 are fully shielded. Therefore, the electronic arc is able to be avoided.

In another one embodiment, in the process of plugging the power supply connector 110 into the power input connector 191, the first detection pin 116 may be electrically coupled to the second detection pin 196 first. Further, the power supply pin 114 and the power input pin 194 are not electrically coupled to each other until the first ground pin 112 and the second ground pin 192 are fully shielded by the insulating element 193. Therefore, when the first ground pin 112 and the second ground pin 192 are not fully shielded, the power conversion device 100 does not provide power to the electronic device 190 since the power supply pin 114 and the power input pin 194 have not been coupled to each other yet. After the power supply connector 110 is electrically coupled to power input connector 190 and the first ground pin 112 and the second ground pin 192 are fully shielded, the power supply pin 114 is electrically coupled to the power input pin 194. Since the first detection pin 116 is coupled to the second detection pin 196, the detection circuit 170 configures the switch circuit 150 to be conducted to make the voltage conversion circuit 130 and the power supply pin 114 (and the power input pin 194) to become short-circuited, such that the voltage conversion circuit 130 provide power to the electronic device 190. Therefore, even if the first detection pin 116 has been electrically coupled to the second detection pin 196, the power supply pin 114 and the power input pin 194 are not electrically coupled to each other and the power conversion device 100 does not provide power to the electronic device 190 until the first ground pin 112 and the second ground pin 192 are fully shielded. Therefore, the electronic arc is able to be avoided.

In the above drawings, the first ground pin 112, the power supply pin 114, the first detection pin 116, the second ground pin 192, the power input pin 194 and the second detection pin 196 are illustrated by using a single column or a single strip for ease of explanation. However, the pins described above may be implemented by one or more strips, sheets or columns to achieve the purpose of electrical connection.

Figure 3:
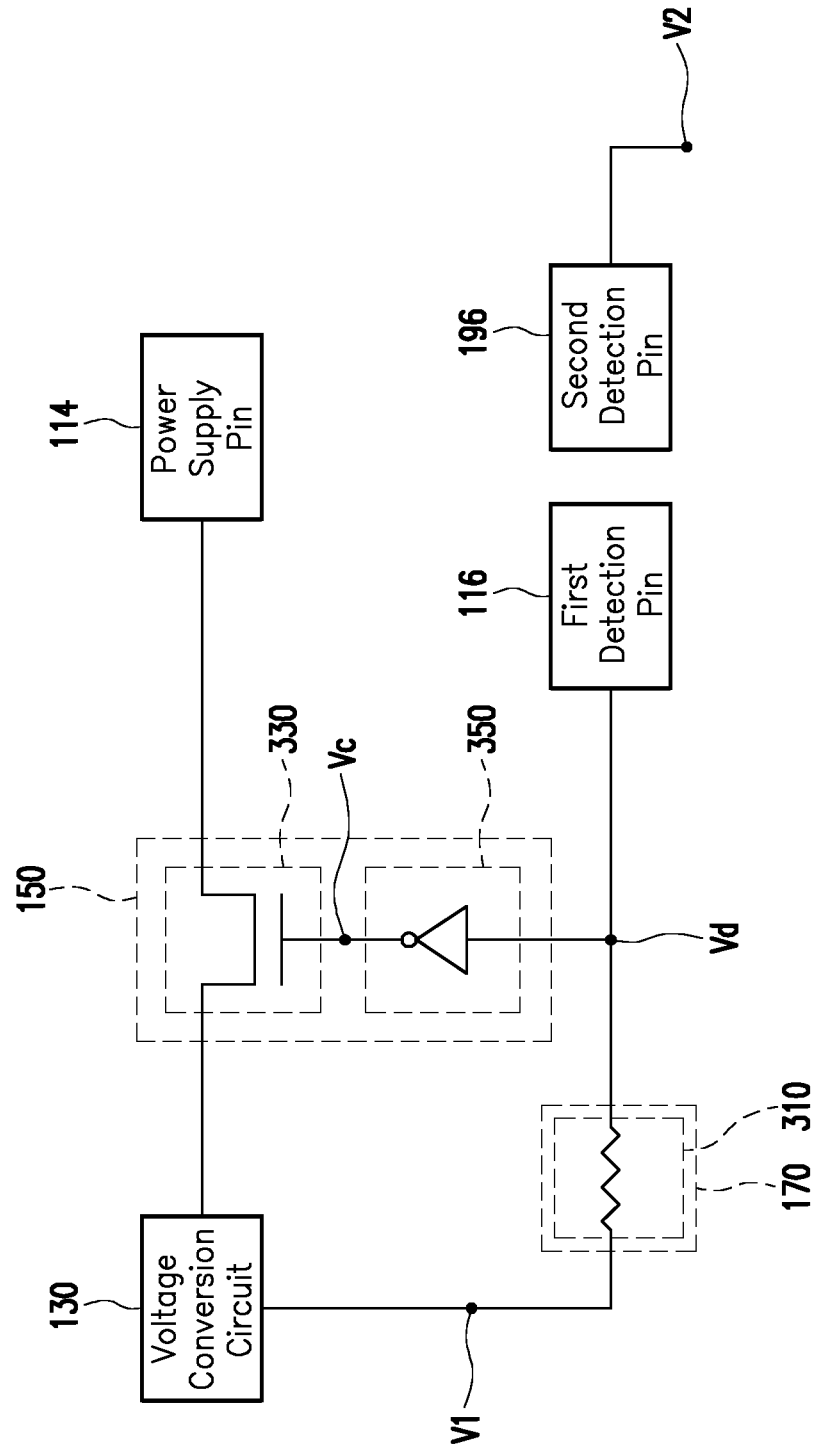
FIG. 3 is a function block diagram illustrating the switch circuit and the detection circuit according to one embodiment of the disclosure.

FIG. 3 is a function block diagram illustrating the switch circuit 150 and the detection circuit 170 according to one embodiment of the disclosure.

In the embodiment of FIG. 3, the detection circuit 170 includes a resistor 310. Further, a first voltage level V1 is set at a high voltage level (e.g., 5V provided by the voltage conversion circuit 130, wherein the related circuit is not shown), and a second voltage level V2 is set at a low voltage level (e.g., 0V of the ground terminal). A first end of the resistor 310 is electrically coupled to the first voltage level V1, and a second end of the resistor 310 is electrically coupled to the switch circuit 150 and the first detection pin 116. The detection voltage Vd outputted to the switch circuit 150 by the detection circuit 170 is equal to the voltage of the second end of the resistor 310. The switch circuit 150 includes the transistor switch 330 and the logic circuit 350. The transistor switch 330 is electrically coupled to the voltage conversion circuit 130 and the power supply pin 114, and the logic circuit 350 is electrically coupled to the detection circuit 170 and the transistor switch 330. The first end of the detection circuit 170 is electrically coupled to the first voltage level V1 outputted by the voltage conversion circuit 130, and the second end of the detection circuit 170 is electrically coupled to the first detection pin 116. When the first detection pin 116 is electrically coupled to the second voltage level V2 of the second detection pin 196 and the second voltage level V2 is lower than the first voltage level V1, the detection voltage Vd outputted to the switch circuit 150 by the detection circuit 170 is pulled down to the low voltage level and the logic circuit 350 configures the transistor switch 330 to be conducted according to the detection voltage Vd at the low voltage level. When the transistor switch 330 is conducted, the voltage conversion circuit 130 provides the power to the electronic device 190 through the switch circuit 150 and the power supply pin 114.

In the embodiment of FIG. 3, the transistor switch 330 may be implemented by a P-type Metal Oxide Semiconductor Field Effect Transistor (MOSFET). In other embodiments, the transistor switch 330 may be implemented by one or more other circuit components. The first end of the transistor switch 330 is electrically coupled to the voltage conversion circuit 130, and the second end of the transistor switch 330 is electrically coupled to the power supply pin 114. The logic circuit 350 in FIG. 3 primarily functions as an inverter and may be implemented by suitable analog circuit components and/or digital circuit components. The first end of the logic circuit 350 is electrically coupled to the detection circuit 170, and the second end of the logic circuit 350 is electrically coupled to a control end of the transistor switch 330.

When the first detection pin 116 is not electrically coupled to the second detection pin 196, the detection voltage Vd outputted to the switch circuit 150 by the detection circuit 170 becomes the first voltage level V1 at the high voltage level (e.g., 5v), the first end of the logic circuit 350 receives the detection voltage Vd at the high voltage level, and the second end of the logic circuit 350 outputs a control voltage Vc at the low voltage level to the control end of the transistor switch 330, such that the P-type transistor switch 330 is non-conducted.

When the first detection pin 116 is electrically coupled to the second detection pin 196, the voltage of the second end of the resistor 310 is equal to the second voltage level V2 (i.e., 0V) of the first detection pin 116 and the second detection pin 196, and the detection voltage Vd outputted to the switch circuit 150 by the detection circuit 170 becomes the second voltage level V2 at the low voltage level (e.g., 0V). The first end of the logic circuit 350 receives the detection voltage Vd at the low voltage level, the second end of the logic circuit 350 outputs the control voltage Vc at the high voltage level to the control end of the transistor switch 330, such that the P-type transistor switch 330 is conducted.

In the above embodiments, the shape, the size or the structure of the power supply connector 110 and the power input connector 191 may be modified according to the different design consideration. For instance, in one embodiment, the structure of the power supply connector 110 and the structure of the power input connector 191 may be exchanged, and hence the power input connector 191 is configured to be plugged into the space formed by the power supply connector 110.

In summary, in the embodiments of the disclosure set above, by appropriately designing the structures and the corresponding circuits of the power supply connector 110 and the power input connector 191, no matter what the size or the length of the power supply pin 114, the first detection pin 116, the power input pin 194 and the second detection pin 196 are, the power supply pin 114 and the first detection pin 116 are not electrically coupled to the power input pin 194 and the second detection pin 196 respectively until the first ground pin 112 and the second ground pin 192 are fully shielded. When the first ground pin 112 and the second ground pin 192 are fully shielded and there is not metal exposed to the air, the power conversion device 100 starts to provide power to the electronic device 190, and thus to avoid the electronic arc to improve safety significantly.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A power conversion device, configured to be electrically coupled to a power source to provide power to an electronic device, comprising:

a power supply connector, comprising a first ground pin, a power supply pin and a first detection pin respectively configured to be electrically coupled to a second ground pin, a power input pin and a second detection pin of a power input connector of the electronic device;

a voltage conversion circuit, configured to be electrically coupled to the power source to provide power at an output voltage level suitable for the electronic device according to the power source;

a switch circuit, electrically coupled to the voltage conversion circuit and the power supply pin; and a detection circuit, electrically coupled to the first detection pin, the voltage conversion circuit and the switch circuit for configuring the switch circuit to be conducted or non-conducted, wherein after the power supply connector is electrically coupled to the power input connector and the first ground pin and the second ground pin are fully shielded, the power supply pin and the first detection pin are electrically coupled to the power input pin and the second detection pin respectively; when the detection circuit detects the first detection pin is electrically coupled to the second detection pin, the detection circuit configures the switch circuit to be conducted, such that the voltage conversion circuit provides power to the electronic device through the switch circuit and the power input pin, wherein the detection circuit comprises a first end coupled to a first voltage level outputted by the voltage conversion circuit and a second end coupled to the first detection pin, and when the first detection pin is coupled to a second voltage level at the second detection pin and the second voltage level is lower than the first voltage level, a detection voltage outputted to the switch circuit by the detection circuit is pulled down to a low voltage level and the switch circuit is conducted.

2. The power conversion device according to claim 1, wherein when the first ground pin and the second ground pin are not fully shielded, the detection circuit configures the switch circuit to be non-conducted, and the voltage conversion circuit and the power input pin become open-circuited; after the power supply connector is electrically coupled to the power input connector and the first ground pin and the second ground pin are fully shielded, the first detection pin is electrically coupled to the second detection pin, and the detection circuit configures the switch circuit to be conducted, such that the voltage conversion circuit provides power to the electronic device through the switch circuit and the power supply pin.

3. The power conversion device according to claim 1, wherein when the first ground pin and the second ground pin are not fully shielded, the first detection pin is electrically coupled to the second detection pin, the detection circuit configures the switch circuit to be conducted, and the power supply pin is not electrically coupled to the power input pin; after the power supply connector is coupled to the power input connector and the first ground pin and the second ground pin are fully shielded, the power supply pin is electrically coupled to the power input pin.

4. The power conversion device according to claim 1, wherein the switch circuit comprises:

a transistor switch electrically coupled to the voltage conversion circuit and the power supply pin;

a logic circuit electrically coupled to the detection circuit and the transistor switch; and when the detection voltage outputted by the detection circuit is pulled down to the low voltage level, the logic circuit configures the transistor switch to be conducted according to the detection voltage.

5. The power conversion device according to claim 1, wherein the first ground pin surrounds the power supply pin and the first detection pin; and the power supply connector comprises an insulating element disposed between the first ground pin and the power supply pin and disposed between the first ground pin and the first detection pin.

* * * * *